US012255200B1

(12) United States Patent
See et al.

(10) Patent No.: US 12,255,200 B1
(45) Date of Patent: Mar. 18, 2025

(54) TRENCH ISOLATION STRUCTURES WITH VARYING DEPTHS AND METHOD OF FORMING THE SAME

(71) Applicant: GlobalFoundries Singapore Pte. Ltd., Singapore (SG)

(72) Inventors: Yong Wah See, Singapore (SG); Guowei Zhang, Singapore (SG); Ee Jan Khor, Singapore (SG); Chin Leng Ko, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/766,596

(22) Filed: Jul. 8, 2024

(51) Int. Cl.
  *H01L 27/02* (2006.01)
  *H01L 21/762* (2006.01)
  *H01L 21/768* (2006.01)

(52) U.S. Cl.
  CPC .... *H01L 27/0207* (2013.01); *H01L 21/76229* (2013.01); *H01L 21/76831* (2013.01)

(58) Field of Classification Search
  CPC ........... H01L 27/0207; H01L 21/76229; H01L 21/76831
  See application file for complete search history.

(56) References Cited

U.S. PATENT DOCUMENTS

| | | | | |
|---|---|---|---|---|
| 5,536,675 A | * | 7/1996 | Bohr | H01L 21/76229 257/E21.548 |
| 6,977,404 B2 | * | 12/2005 | Katsumata | H01L 29/945 257/E21.654 |
| 7,015,086 B2 | * | 3/2006 | Chang | H01L 21/763 257/E21.549 |
| 8,258,028 B2 | * | 9/2012 | Tilke | H10B 41/40 438/296 |
| 9,230,861 B2 | * | 1/2016 | Chetlur | H01L 21/76879 |
| 2001/0006839 A1 | * | 7/2001 | Yeo | H01L 21/76229 438/424 |
| 2002/0076900 A1 | * | 6/2002 | Park | H01L 21/76229 438/424 |
| 2008/0265363 A1 | * | 10/2008 | Gambino | H01L 29/7835 257/E21.549 |
| 2011/0037133 A1 | * | 2/2011 | Su | H01L 31/1808 257/E31.127 |
| 2012/0153385 A1 | * | 6/2012 | Seo | H10B 12/0335 257/334 |
| 2013/0270711 A1 | * | 10/2013 | Hebding | H01L 25/0652 438/455 |
| 2015/0303252 A1 | * | 10/2015 | Won | H01L 21/76229 257/506 |

(Continued)

OTHER PUBLICATIONS

Forsberg, M., Johansson, T., Liu, W., & Vellaikal, M. (2004). A shallow and deep trench isolation process module for RF BiCMOS. Journal of the Electrochemical Society, 151(12), G839, DOI 10.1149/1.1811596.

*Primary Examiner* — Nathan W Ha
(74) *Attorney, Agent, or Firm* — David Cain

(57) ABSTRACT

The present disclosure generally relates to trench isolation structures for semiconductor devices. More particularly, the present disclosure relates to semiconductor devices having trench isolation structures with varying depths for electrically isolating integrated circuit (IC) components in the semiconductor devices. The present disclosure also relates to method of forming the trench isolation structures.

20 Claims, 12 Drawing Sheets

(56) References Cited

U.S. PATENT DOCUMENTS

| | | | |
|---|---|---|---|
| 2016/0163709 A1* | 6/2016 | Takesako | H01L 21/76816 |
| | | | 257/774 |
| 2016/0322262 A1* | 11/2016 | Li | H01L 21/76229 |
| 2019/0139997 A1* | 5/2019 | Chiang | H01L 27/14689 |
| 2023/0056408 A1* | 2/2023 | Lin | H01L 21/76831 |
| 2023/0411295 A1* | 12/2023 | Kato | H01L 21/76865 |
| 2024/0282762 A1* | 8/2024 | Izumi | H01L 21/743 |
| 2024/0290885 A1* | 8/2024 | Yeong | H01L 29/775 |

* cited by examiner

TRENCH ISOLATION STRUCTURES WITH VARYING DEPTHS AND METHOD OF FORMING THE SAME

FIELD OF THE INVENTION

The present disclosure generally relates to trench isolation structures for semiconductor devices. More particularly, the present disclosure relates to semiconductor devices having trench isolation structures with varying depths for electrically isolating integrated circuit (IC) components in the semiconductor devices. The present disclosure also relates to a method of forming the trench isolation structures.

BACKGROUND

Isolation trenches are commonly used in semiconductor devices (e.g., complementary metal-oxide semiconductor (CMOS), bipolar, and a combination of bipolar and CMOS (BiCMOS)) to improve the operation of transistors and other active components of the semiconductor devices. Conventional techniques enable the formation of shallow isolation trenches to isolate active semiconductor regions on the surface of a semiconductor substrate. However, with the advancement of IC device technology (e.g., high voltage field-effect transistors, lateral double-diffused (LD) transistors, bipolar junction transistors, etc.) and an increasing demand for smaller device dimensions, there is a need for devices to incorporate multiple isolation trenches with varying depths to improve overall device performance. However, the process for fabricating isolation trenches with different depths can be complex and defect-prone.

SUMMARY

In an aspect of the present disclosure, there is provided a structure having a first trench in a substrate, the first trench having sidewalls and a bottom located at a first depth, a second trench in the substrate, the second trench having sidewalls and a bottom located at the first depth, a first dielectric liner on the sidewalls and the bottom of the first trench, a second dielectric liner on the sidewalls and the bottom of the second trench, a first dielectric layer in the first trench and being disposed on the first dielectric liner, a second dielectric layer in the second trench and being disposed on the second dielectric liner, a third trench extending from the bottom of the second trench into the substrate, the third trench having a bottom located at a second depth, the second depth is deeper than the first depth, and a dielectric isolation structure having an upper section in the second trench and a lower section in the third trench. The upper section of the dielectric isolation structure is laterally surrounded by the second dielectric layer in the second trench. The first dielectric layer is of a different material from the first dielectric liner. The first dielectric layer is of the same material as the second dielectric layer. The second dielectric layer is of a different material from the second dielectric liner. The dielectric isolation structure is of a different material from the second dielectric layer.

In another aspect of the present disclosure, there is provided a semiconductor device having a first trench in a substrate, the first trench having sidewalls and a bottom located at a first depth, a second trench in the substrate, the second trench having sidewalls and a bottom located at the first depth, a first dielectric liner on the sidewalls and the bottom of the first trench, a second dielectric liner on the sidewalls and the bottom of the second trench, a first dielectric layer in the first trench and being disposed on the first dielectric liner, a second dielectric layer in the second trench and being disposed on the second dielectric liner, a third trench extending from the bottom of the second trench into the substrate, the third trench having a bottom located at a second depth, the second depth is deeper than the first depth, a dielectric isolation structure having an upper section in the second trench and a lower section in the third trench, a gate over the first trench, and a source region and a drain region in the substrate, in which the first trench is laterally between the source region and the drain region. The upper section of the dielectric isolation structure is laterally surrounded by the second dielectric layer in the second trench. The first dielectric layer is of a different material from the first dielectric liner. The first dielectric layer is of the same material as the second dielectric layer. The second dielectric layer is of a different material from the second dielectric liner. The dielectric isolation structure is of a different material from the second dielectric layer. The second trench and the third trench laterally enclose the first trench, the gate, the source region, and the drain region.

In yet another aspect of the present disclosure, there is provided a method of forming a structure in a semiconductor device, the method includes forming a first trench and a second trench in a substrate, the first trench having sidewalls and a bottom located at a first depth, the second trench having sidewalls and a bottom located at the first depth, forming a first dielectric liner on the sidewalls and the bottom of the first trench and a second dielectric liner on the sidewalls and the bottom of the second trench, forming a first dielectric layer on the first dielectric liner and a second dielectric layer on the second dielectric liner, in which the first dielectric layer is of the same material as the second dielectric layer, forming a third trench extending from the bottom of the second trench into the substrate, the third trench having a bottom located at a second depth, the second depth is deeper than the first depth, and forming a dielectric isolation structure having an upper section in the second trench and a lower section in the third trench, the upper section of the dielectric isolation structure is laterally surrounded by the second dielectric layer in the second trench, in which the dielectric isolation structure is of a different material from the second dielectric layer.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of certain features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments or implementations of the present disclosure are described below. The embodiments or implementations disclosed herein are exemplary and not intended to be exhaustive or limiting to the present disclosure.

Figure 1:
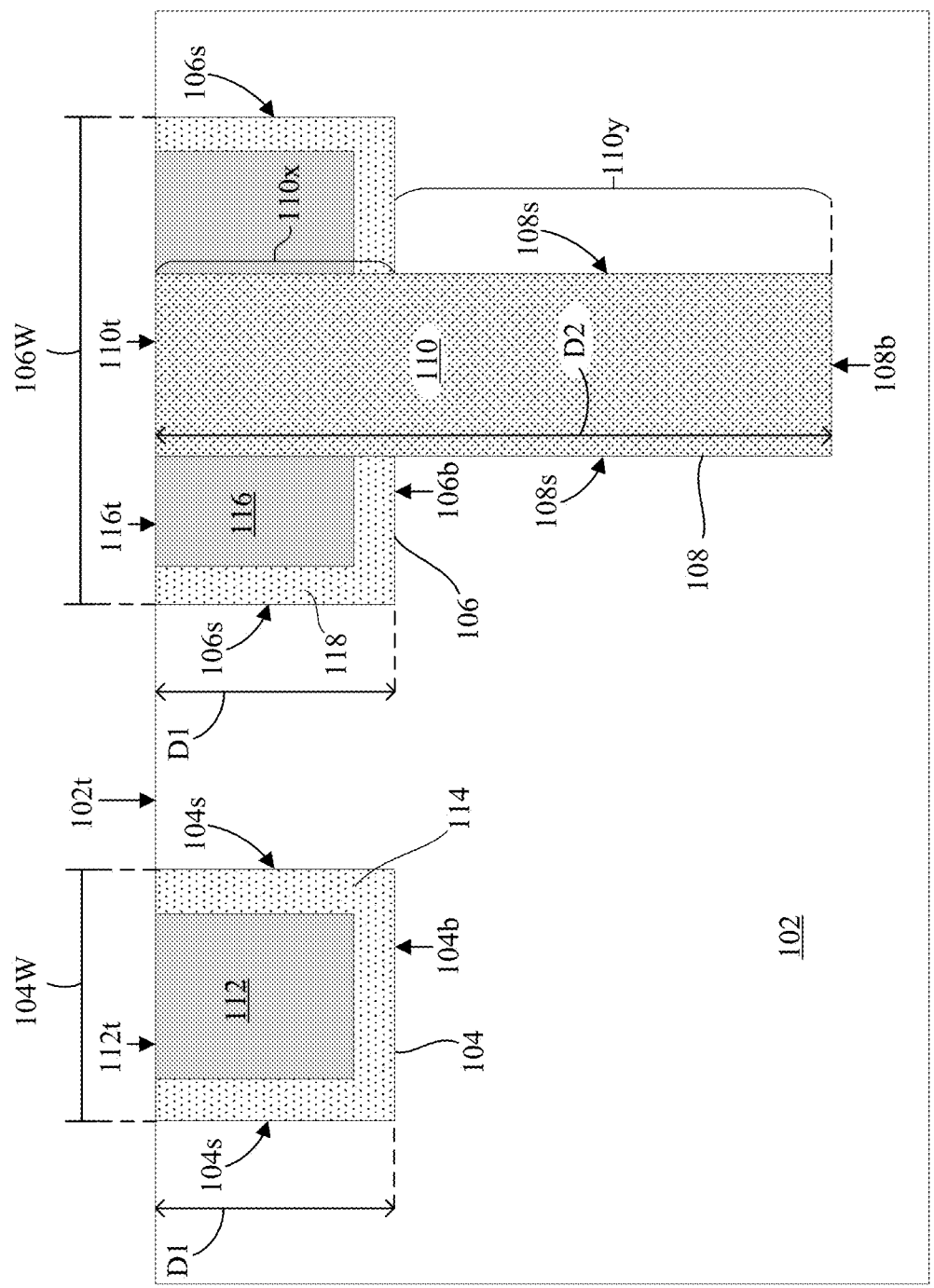
FIG. 1 is a cross-sectional view of an example of a structure for a semiconductor device.

Referring to FIG. 1, an example of a structure for isolating integrated circuit (IC) components in a semiconductor device may include a substrate 102, a first trench 104 in the substrate 102, a second trench 106 in the substrate 102, and a third trench 108 in the substrate 102. The first trench 104 may have sidewalls 104s and a bottom 104b. The second trench 106 may have sidewalls 106s and a bottom 106b. The third trench 108 may have sidewalls 108s and a bottom 108b. The third trench 108 may extend from the bottom 106b of the second trench 106 into the substrate 102. The first trench 104 may have a width 104W and the second trench 106 may have a width 106W. The second trench 106 may have a larger width than the first trench 104. In an embodiment, the width 106W of the second trench 106 may be at least two times larger than the width 104W of the first trench 104.

The substrate 102 may have a top surface 102t. The substrate 102 may be made of any semiconductor material, such as silicon, germanium, silicon germanium (SiGe), silicon carbide, and those consisting essentially of III-V compound semiconductors, such as GaAs, II-VI compound semiconductors such as ZnSe. The substrate 102 may have an amorphous, polycrystalline, or monocrystalline structure.

The bottom 104b of the first trench 104 and the bottom 106b of the second trench 106 may be located at a first depth D1. The first depth D1 may be defined as a vertical distance between the bottom 104b of the first trench 104 (or the bottom 106b of the second trench 106), and the top surface 102t of the substrate 102. In some embodiments, the bottom of the 104b of the first trench 104 may be located at the same depth as the bottom 106b of the second trench 106. The bottom of the third trench 108 may be located at a second depth D2. The second depth D2 may be defined as a vertical distance between the bottom 108b of the third trench 108 and the top surface 102t of the substrate 102. The second depth D2 may be deeper than the first depth D1. In some embodiments, the bottom 108b of the third trench 108 may be lower than the bottom 104b of the first trench 104 and the bottom 106b of the second trench 106.

A first dielectric liner 114 may be disposed on the sidewalls 104s and the bottom 104b of the first trench 104. A first dielectric layer 112 may be in the first trench 104 and be disposed on the first dielectric liner 114. The first dielectric layer 112 may have a top surface 112t. The first dielectric layer 112 may be of a different material from the first dielectric liner 114. In some embodiments, the first trench 104 may be filled with the first dielectric liner 114 and the first dielectric layer 112 only. A second dielectric liner 118 may be disposed on the sidewalls 106s and the bottom 106b of the second trench 106. A second dielectric layer 116 may be in the second trench 106 and be disposed on the second dielectric liner 118. The second dielectric layer 116 may have a top surface 116t. The second dielectric layer 116 may be of a different material from the second dielectric liner 118.

A dielectric isolation structure 110 may be disposed in the second trench 106 and the third trench 108. For example, the dielectric isolation structure 110 may have an upper section 110x and a lower section 110y. The upper section 110x of the dielectric isolation structure 110 may be in the second trench 106 while the lower section 110y of the dielectric isolation structure 110 may be in the third trench 108. The upper section 110x of the dielectric isolation structure 110 may be laterally surrounded by the second dielectric layer 116 and the second dielectric liner 118 in the second trench 106. In an embodiment, the upper section 110x of the dielectric isolation structure 110 may directly contact the second dielectric layer 116 and the second dielectric liner 118. The lower section 110y of the dielectric isolation structure 110 may directly contact the substrate 102. In some embodiments, the second trench 106 may be filled with the second dielectric liner 118, the second dielectric layer 116, and the upper section of the dielectric isolation structure only. The third trench 108 may be filled with the lower section 110y of the dielectric isolation structure 110 only. The dielectric isolation structure 110 may have a top surface 110t. The top surface 110t of the dielectric isolation structure 110 may be substantially coplanar with the top surface 116t of the second dielectric layer 116, the top surface 112t of the first dielectric layer 112, and the top surface 102t of the substrate 102.

Exemplary materials for the first dielectric layer 112 and the second dielectric layer 116 may include, but are not limited to, a nitrogen-containing material such as nitrides of silicon, silicon nitride, silicon oxynitride, or nitrogen-doped silicon carbide. Exemplary materials for the first dielectric liner 114 and the second dielectric liner 118 may include, but are not limited to, an oxygen-containing material such as oxides of silicon, silicon dioxide, or silicon-rich silicon oxide. Exemplary materials for the dielectric isolation structure 110 may include, but are not limited to, an oxygen-containing material such as oxides of silicon, tetraethyl orthosilicate (TEOS), or silicon-rich silicon oxide.

The dielectric isolation structure 110 may be of a different material from the second dielectric layer 116 and the first dielectric layer 112. The first dielectric liner 114 and the second dielectric liner 118 may have the same material as the dielectric isolation structure 110. The first dielectric layer 112 may be of the same material as the second dielectric layer 116. In an embodiment, the first dielectric layer 112 and the second dielectric layer 116 may include a nitrogen-containing material, such as silicon nitride, while the dielectric isolation structure 110 may include an oxygen-containing material, such as silicon oxide. In another embodiment, the dielectric isolation structure 110 may be made of an oxygen-containing material and may not have a polysilicon core.

Figure 2:
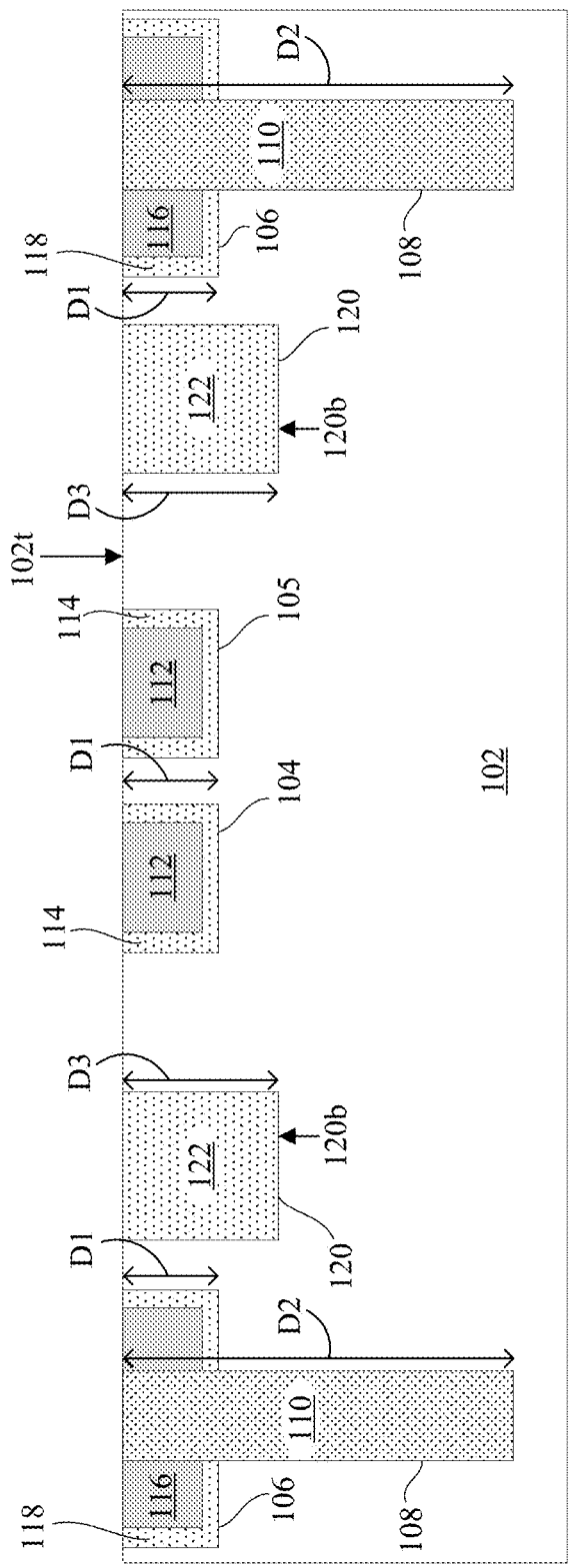
FIG. 2 is a cross-sectional view of another example of a structure for a semiconductor device.
Figure 3:
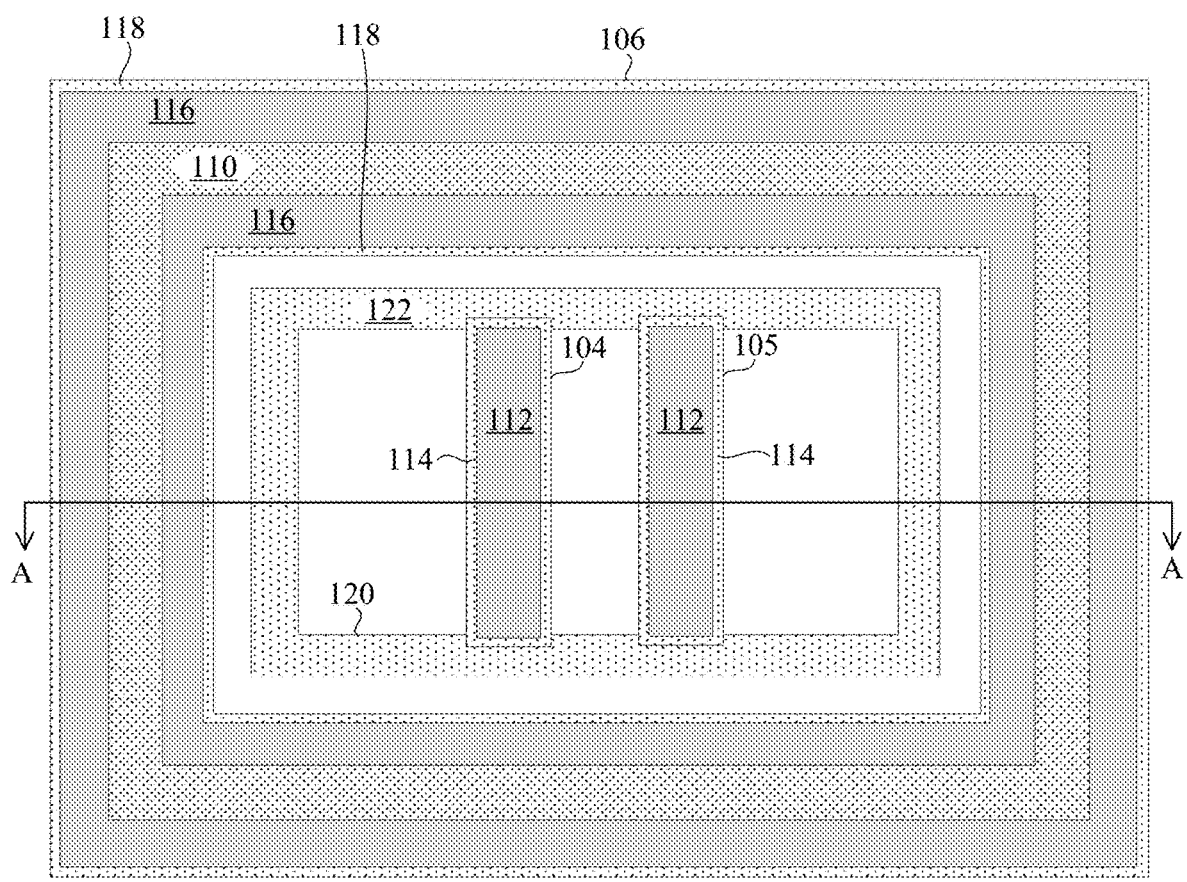
FIG. 3 is a top-down view of the structure shown in FIG. 2.

FIG. 2 shows a cross-sectional view of another example structure for isolating integrated circuit (IC) components in a semiconductor device, while FIG. 3 shows a top-down view of the structure shown in FIG. 2. Section line AA in FIG. 3 indicates the cross-section from which the view in FIG. 2 is taken from. Like reference numerals in FIG. 2 and FIG. 3 refer to like features in FIG. 1. As shown in FIG. 2 and FIG. 3, the structure may include the first trench 104, the second trench 106, and the third trench 108 as described in FIG. 1. The structure may further include a fourth trench 120 in the substrate 102 and a fifth trench 105 in the substrate 102. The fifth trench 105 may be identical to the first trench 104. The fifth trench 105 may have the first dielectric liner 114 and the first dielectric layer 112. In the example shown in FIG. 3, the second trench 106 and the third trench 108 may both laterally enclose the fourth trench 120, the first trench 104, and the fifth trench 105. The fourth trench 120 may laterally enclose the first trench 104 and the fifth trench 105. The fourth trench 120 may be concentric with the second trench 106 and the third trench 108.

The fourth trench 120 may be laterally between the first trench 104 and the second trench 106. The fourth trench 120 may have a bottom 120b located at a third depth D3. The third depth D3 may be defined as a vertical distance between the bottom 120b of the fourth trench 120 and the top surface 102t of the substrate 102. The third depth D3 may be deeper than the first depth D1 and shallower than the second depth D2. In some embodiments, the bottom 120b of the fourth trench 120 may be located vertically between the bottom 104b of the first trench 104 and the bottom 108b of the third trench 108. In some implementations, the third trench 108 may be referred to as a "deep trench", the fourth trench 120 may be referred to as a "shallow trench", and the first trench 104 and the fifth trench 105 may be referred to as an "ultra shallow trench". A trench isolation layer 122 may be formed in the fourth trench 120. The trench isolation layer 122 may be of the same material as the dielectric isolation structure 110.

Figure 4:
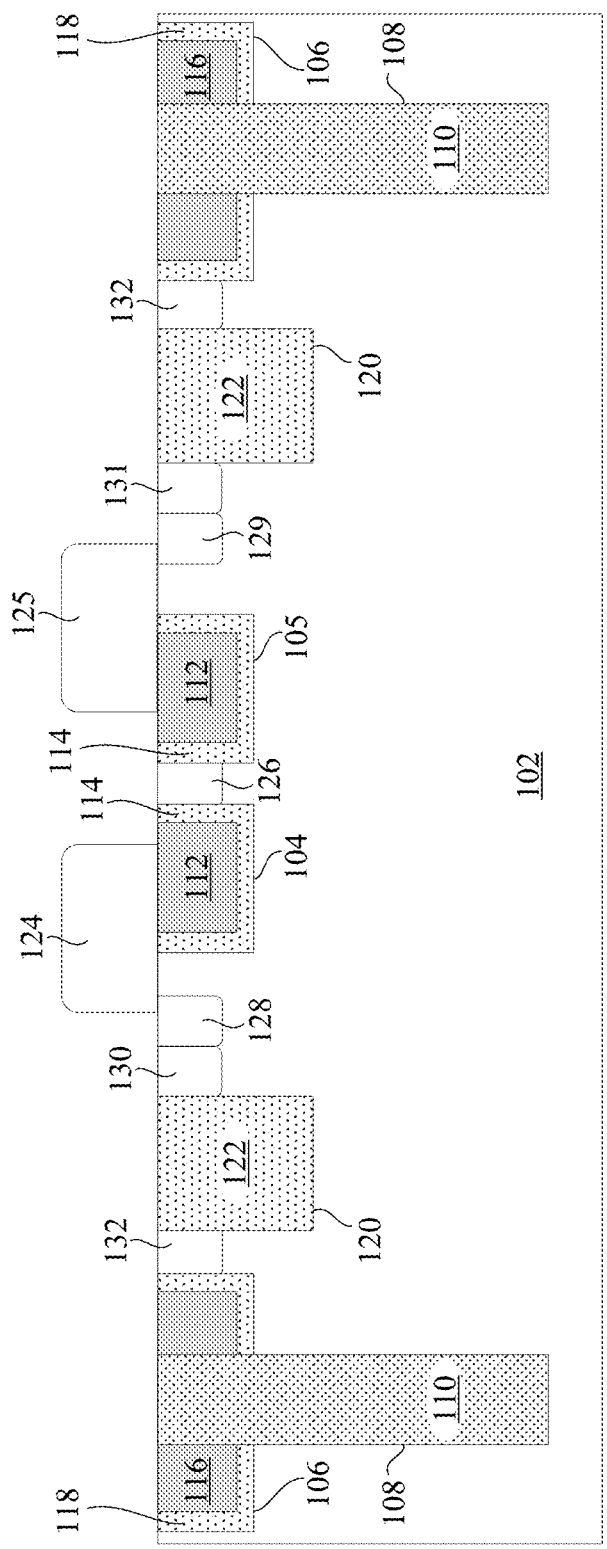
FIG. 4 is a cross-sectional view of an example of a semiconductor device incorporating the structures shown in FIG. 1 and FIG. 2.

Referring to FIG. 4, in which like reference numerals refer to like features in FIG. 1 and FIG. 2, an example semiconductor device incorporating the structures described in FIG. 1 and FIG. 2 may include the first trench 104, the second trench 106, the third trench 108, the fourth trench 120, and the fifth trench 105. A first gate 124 may be formed over the first trench 104 and a second gate 125 may be formed over the fifth trench 105. The first gate 124 may overlap or partially overlap with the first dielectric liner 114 and the first dielectric layer 112 in the first trench 104. Similarly, the second gate 125 may overlap with the first dielectric liner 114 and the first dielectric layer 112 in the fifth trench 105. Source regions 128, 129 and a drain region 126 may be formed in the substrate 102. The first trench 104 and the first gate 124 may be laterally between the source region 128 and the drain region 126. The fifth trench 105 and the second gate 125 may be laterally between the source region 129 and the drain region 126.

Body regions 130, 131 may be formed in the substrate 102. Body region 130 may abut or directly abut the fourth trench 120 and source region 128. Body region 131 may abut or directly abut the fourth trench 120 and source region 129. The fourth trench 120 may laterally enclose the drain region 126, the first trench 104, the fifth trench 105, the source regions 128, 129, and the body regions 130, 131. A substrate contact region 132 may be formed in the substrate 102. The substrate contact region 132 may be laterally between and may abut or directly abut the second trench 106 and the fourth trench 120. The second trench 106 and the third trench 108 may laterally enclose the drain region 126, the first trench 104, the fifth trench 105, the source regions 128, 129, the body regions 130, 131, the fourth trench 120, and the substrate contact region 132. In some implementations, the semiconductor device 100 may function as a high voltage device or a laterally diffused metal oxide semiconductor (LDMOS) device.

The structure shown in FIG. 4 may be fabricated by performing one or more doping processes on the structure shown in FIG. 3. For example, the formation of the source regions 128, 129, the drain region 126, the body regions 130, 131, and the substrate contact region 132 may include the use of one or more doping processes (e.g., ion implantation) to introduce dopants into the substrate 102. The dopants may be of an N-type conductivity or a P-type conductivity. Exemplary dopants for N-type conductivity doping may include, but are not limited to, arsenic, phosphorus, or antimony. Exemplary dopants for P-type conductivity doping may include, but are not limited to, boron, aluminum, or gallium. A mask may be used in the doping process(es). Formation of the gates 124, 125 may include several steps of deposition and patterning of layers of materials with the use of one or more masks.

Figure 4A:
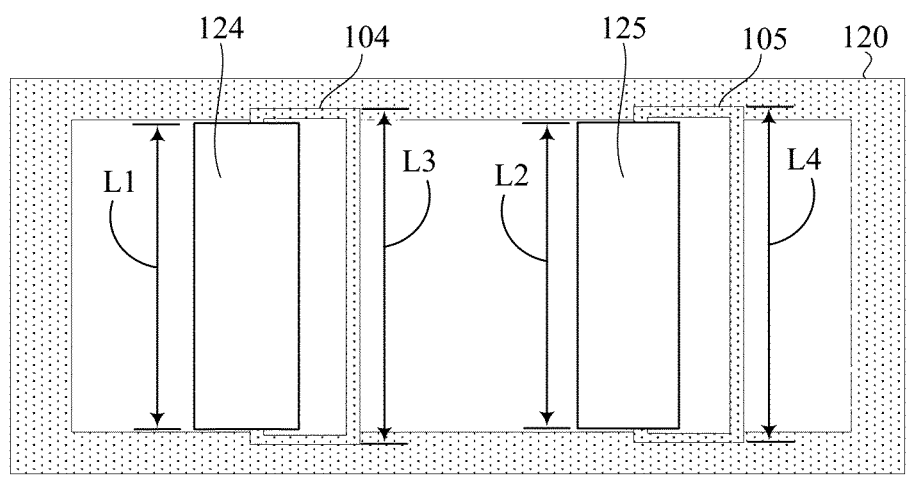
FIG. 4A is a simplified top-down view depicting an orientation of a gate relative to a trench in the semiconductor device shown in FIG. 4.

Referring to FIG. 4A, a simplified top-down view depicting the orientation of the gates 124, 125 and the trenches 104, 105 in the semiconductor device described in FIG. 4 is shown. For simplicity, only the trenches 120, 104, 105 and the gates 124, 125 are illustrated in FIG. 4A. The gates 124, 125 may each have a length L1, L2, respectively. The trenches 104, 105 may each have a longitudinal length L3, L4, respectively. The longitudinal length L3 of trench 104 and the longitudinal length L4 of trench 105 may extend along the same direction as the length L1 of gate 124 and length L2 of gate 125.

FIGS. 5 through 11 show a set of steps that may be used to create the structure described herein.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 5:
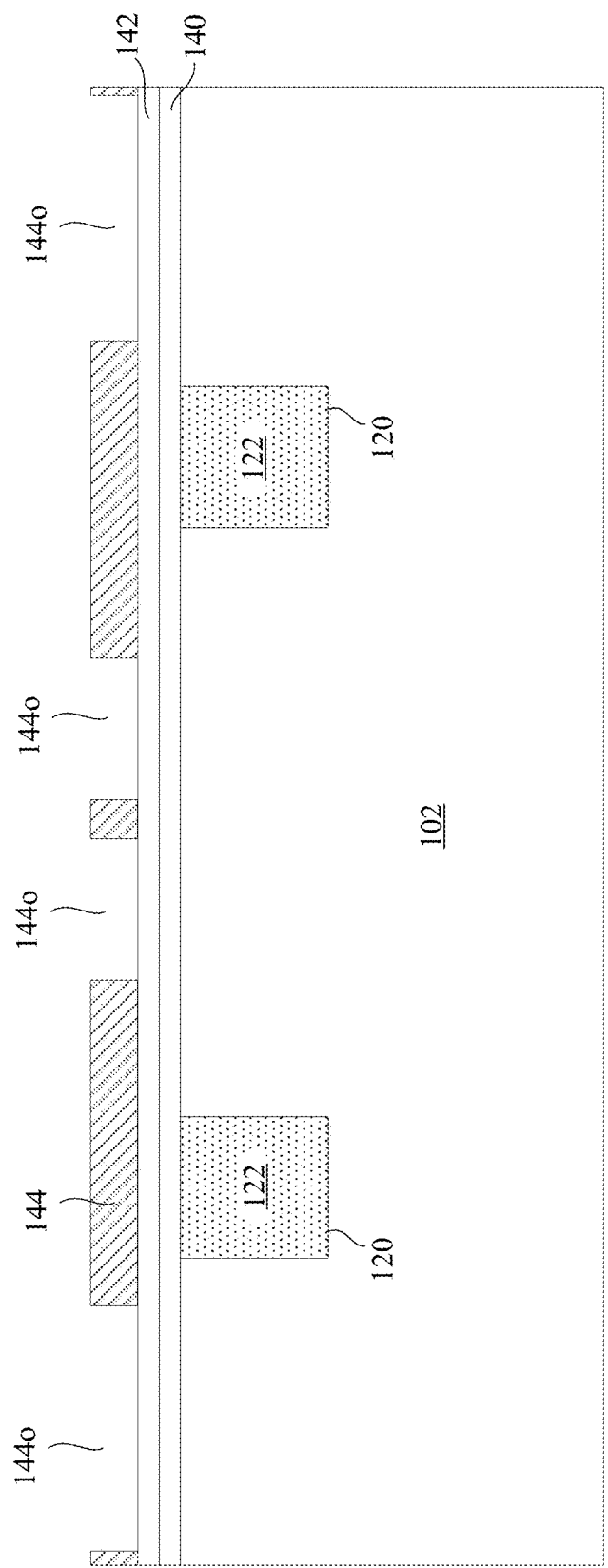
FIG. 5 through FIG. 11 are cross-sectional views depicting structures at various stages of a method of forming the exemplary structure shown in FIG. 2.

Referring to FIG. 5, a structure for the fabrication of the structure described in FIG. 2 may include a substrate 102, a trench 120 formed in the substrate, a first pad dielectric layer 140, and a second pad dielectric layer 142. The trench 120 may be formed by patterning the substrate 102 using patterning techniques to form openings (not shown) and then filling the openings with a trench isolation layer 122 using deposition techniques. The pad dielectric layers 140, 142 may be formed over the substrate 102 and the trench 120 using deposition techniques. A patterned mask layer 144 may be formed on the second dielectric layer 142. For example, the mask layer 144 may be deposited on the second dielectric layer 142 and then patterned using patterning techniques. The patterning of the mask layer 144 may define openings 1440 in the mask layer 144.

Figure 6:
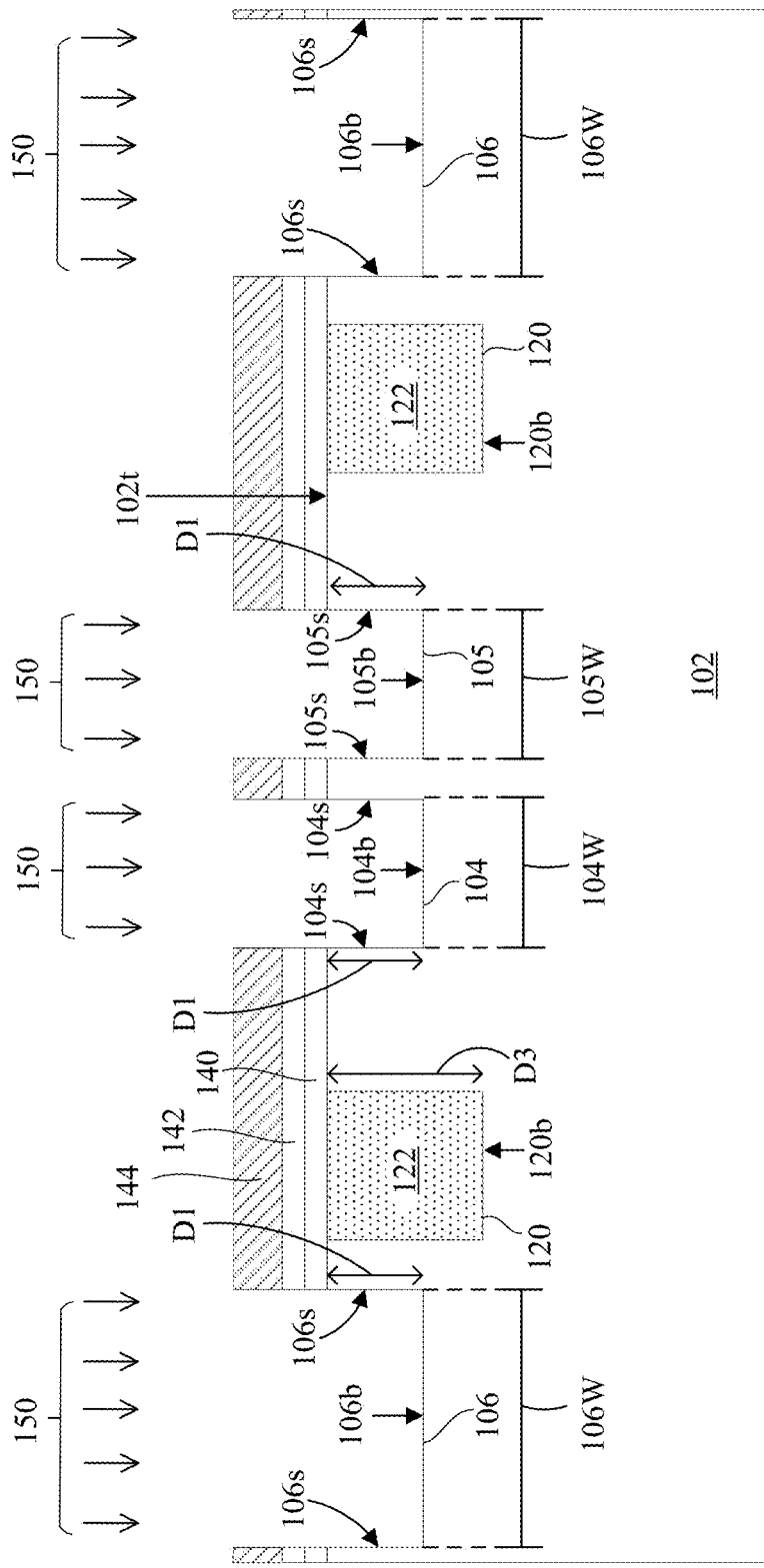

Referring to FIG. 6, trenches 104, 105, 106 may be formed in the substrate 102 by patterning the substrate 102 and the pad dielectric layers 140, 142 using an etching process 150. For example, portions of the substrate 102 and the pad dielectric layers 140, 142 that are not covered by the patterned mask layer 144 (i.e., below the openings 1440 shown in FIG. 5) may be removed by the etching process 150. Each of the trenches 104, 105, 106 may be formed with sidewalls 104s, 105s, 106s, respectively, and a bottom 104b, 105b, 106b, respectively. The trenches 104, 105, 106 may be formed with the same depth. For example, the bottom 104b of trench 104, the bottom 105b of trench 105, and the bottom 106b of trench 106 may be located at a depth D1 measured with reference to the top surface 102t of the substrate 102. The trench 120 may have a bottom 120b located at a depth D2 measured with reference to the top surface 102t of the substrate 102. The depth D1 of the trenches 104, 105, 106 may be shallower than the depth D2 of the trench 120. The trenches 104, 105 may be formed with a width 104W, 105W, respectively while the trench 106 may be formed with a width 106W. The width 104W of trench 104 may be the same as the width 105W of trench 105. The width 106W of trench 106 may be larger than the widths 104W, 105W of trenches 104, 105.

Figure 7:
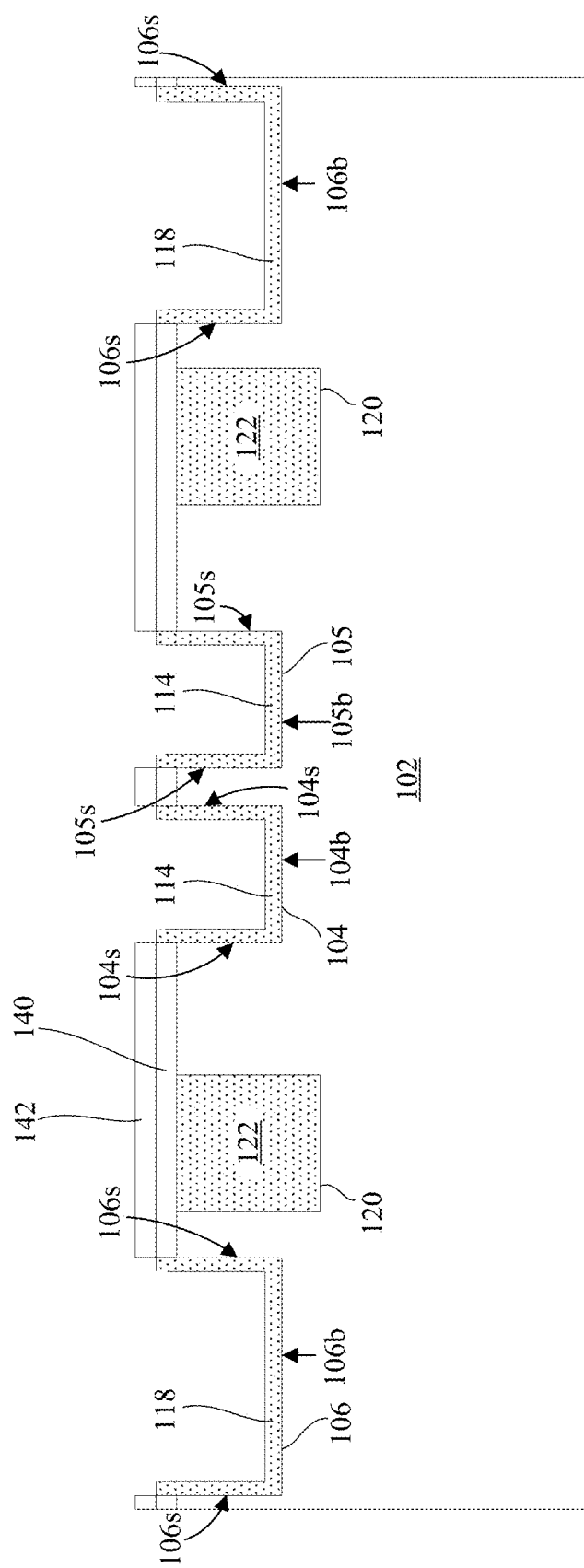

Referring to FIG. 7, a first dielectric liner 114 may be formed in trenches 104, 105 and a second dielectric liner 118 may be formed in trench 106. The dielectric liners 114, 118 may be formed using a thermal oxidation process. Alternatively, the dielectric liners 114, 118 may be deposited into the trenches 104, 105, 106 using deposition techniques. The first dielectric liner 114 may be formed on the sidewalls 104s and the bottom 104b of trench 104 and the sidewalls 105s and the bottom 105b of trench 105. The second dielectric liner 118 may be formed on the sidewalls 106s and the bottom 106b of trench 106.

Figure 8:
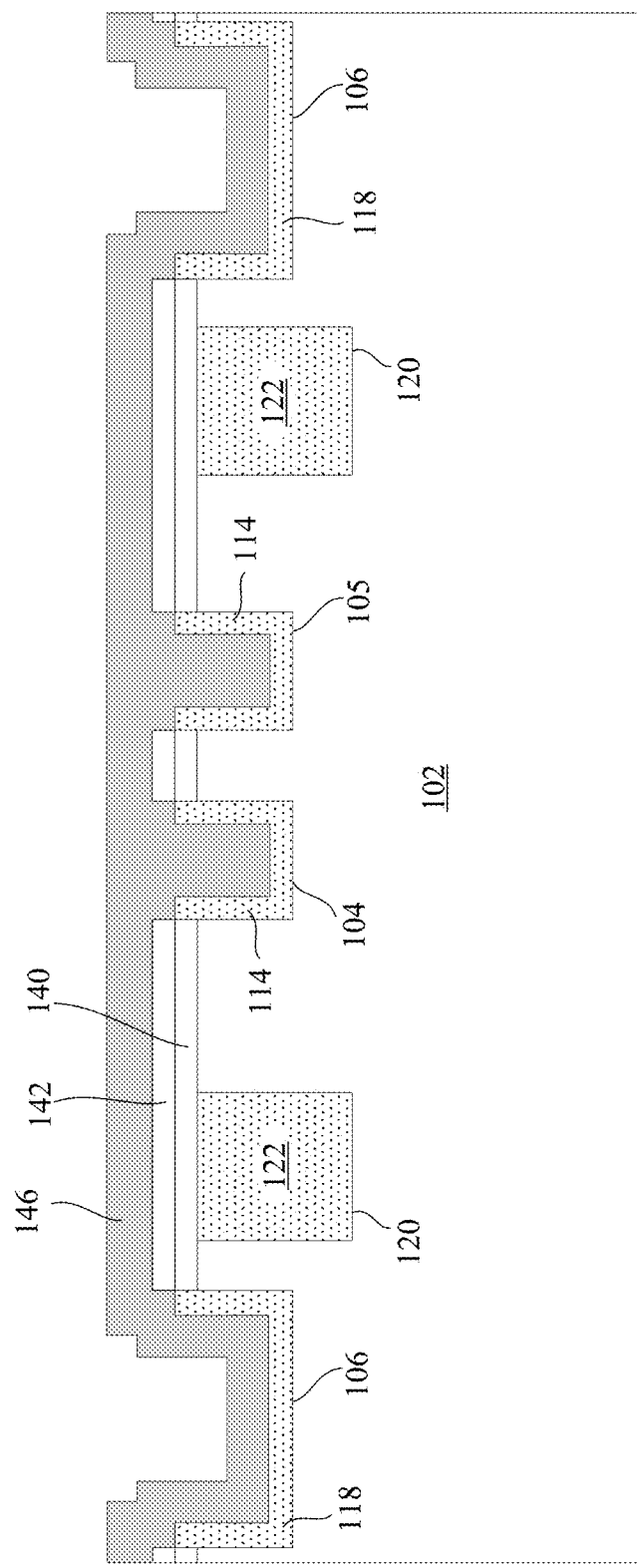

Referring to FIG. 8, a dielectric material layer 146 may be formed over the structure shown in FIG. 7. For example, the dielectric material layer 146 may be deposited on the dielectric liners 114, 118 in the respective trenches 104, 105, 106 and the pad dielectric layer 142 using deposition techniques. In an implementation, the deposition of the dielectric material layer 146 may use a conformal deposition technique such that a horizontal portion of the dielectric material layer 146 overlying the second dielectric liner 118 may have the same thickness as a horizontal portion of the dielectric material layer 146 overlying the pad dielectric layer 142. Since trench 106 has a larger width than trenches 104, 105, the deposition of the dielectric material layer 146 may completely fill the trenches 104, 105 while partially filling the trench 106.

Figure 9:
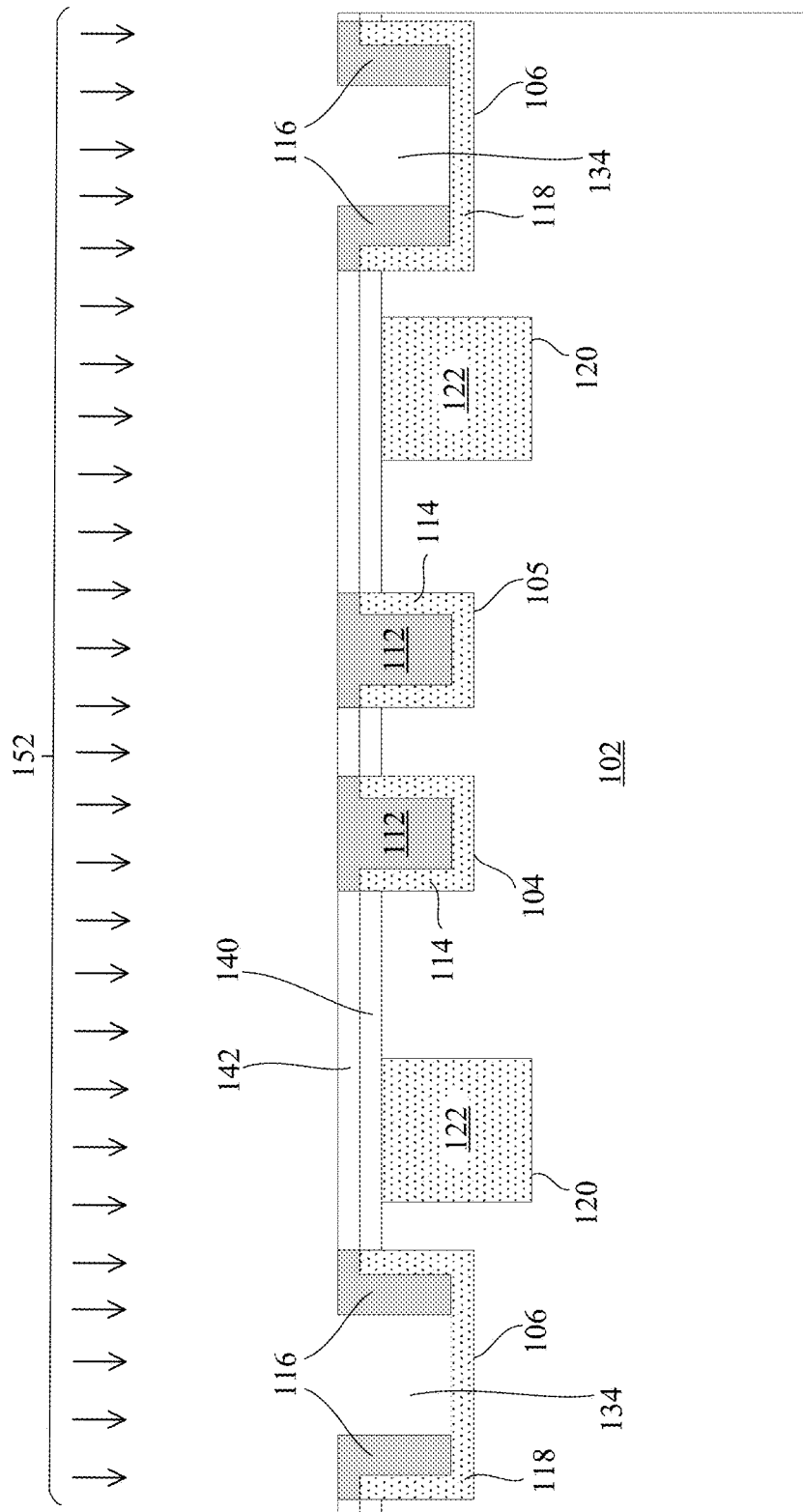

Referring to FIG. 9, an etching process 152 may be performed on the structure shown in FIG. 8. Particularly, the dielectric material layer 146 overlying the dielectric liners 114, 118 and the pad dielectric layer 142 may be etched along a vertical direction using a directional etching process. The etching of the dielectric material layer 146 may expose a portion of the second dielectric liner 118 in the trench 106, while also exposing the pad dielectric layer 142. The remaining portions of the dielectric material layer 146 after the etching process 152 may form a first dielectric layer 112 in the trenches 104, 105 and a second dielectric layer 116 in the trench 106. A cavity 134 may be formed in the trench 106 that overlies the second dielectric liner 118. The first dielectric liner 114 in the trenches 104, 105 may remain covered by the first dielectric layer 112 after the etching process 152.

Figure 10:
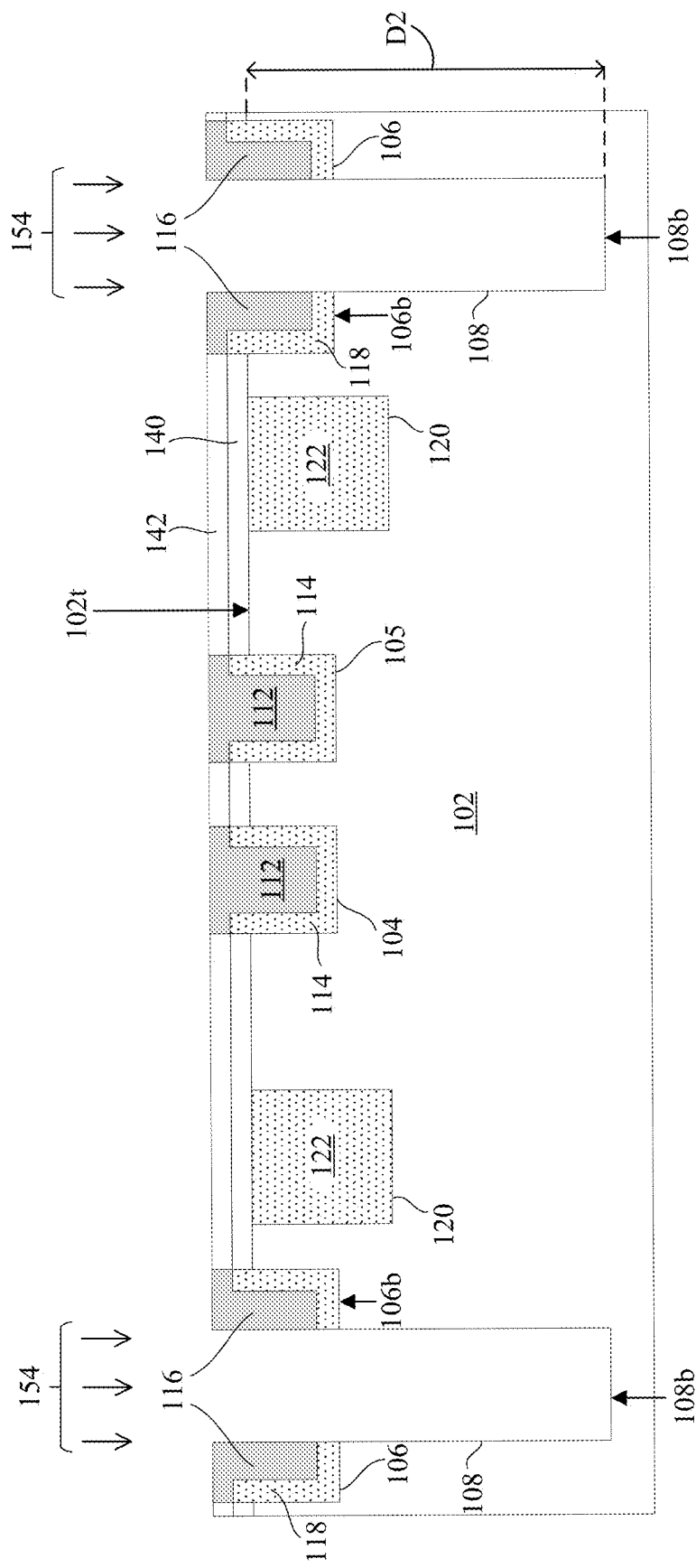

Referring to FIG. 10, a trench 108 extending from the bottom 106b of the trench 106 may be formed in the substrate 102 using an etching process 154 with a mask (not shown). For example, the bottom 106b of the second trench 106 and the exposed portion of the second dielectric liner 118 in the second trench 106 may be etched by directing etchants through the cavity 134 described in FIG. 9 such that the trench 108 extends from the bottom of the second trench 106 into the substrate 102. The trench 108 may be formed with a bottom 108b located at a depth D2 measured with reference to the top surface 102t of the substrate 102, in which the depth D2 of the trench 108 may be deeper than the depth D1 of the trenches 104, 105, 106 and the depth D3 of trench 120.

Figure 11:
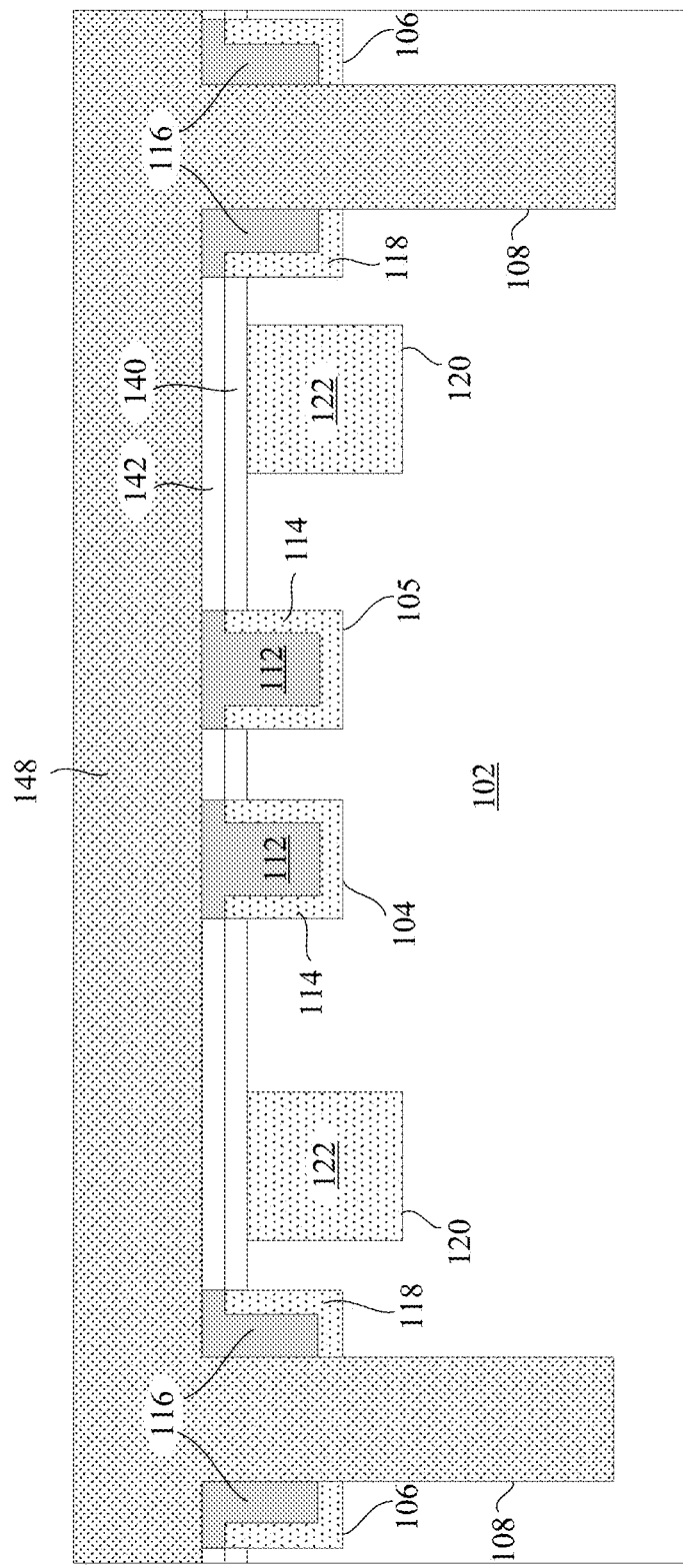

Referring to FIG. 11, a dielectric isolation material layer 148 may be formed over the structure shown in FIG. 10 using deposition techniques. For example, the dielectric isolation material layer 148 may be deposited over the dielectric layers 112, 116, the dielectric liners 114, 118, and completely fill the trenches 106, 108. A high density plasma deposition process may be used to form the dielectric isolation material layer 148. The structure shown in FIG. 11 may undergo further processing to form the structure shown in FIG. 2. For example, a chemical mechanical planarization (CMP) process and one or more etching processes may be performed on the structure shown in FIG. 11 to remove portions of the dielectric isolation material layer 148, the dielectric layers 112, 116, the dielectric liners 114, 118, and the pad dielectric layers 140, 142 such that the top surface 102t of the substrate 102 is exposed. The dielectric isolation material 110 may be formed in the trench 108 after the removal of the portion of the dielectric isolation material layer 148.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment, occurrences of the phrase "in an implementation" herein do not necessarily all refer to the same implementation, and occurrences of the phrase "in an example" herein do not necessarily all refer to the same example.

The descriptions of the various embodiments of the present disclosure have been presented for purposes of illustration, but are not intended to be exhaustive or limited to the embodiments disclosed. Modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the semiconductor isolation structures and methods of manufacture disclosed herein may be used in association with a variety of different integrated circuit products, including, but not limited to, SiGe based devices, CMOS, high voltage semiconductor devices, bipolar, and a combination of bipolar and CMOS (BiCMOS) semiconductor devices, etc.

What is claimed is:

1. A structure comprising:
    a substrate;
    a first trench in the substrate, the first trench having sidewalls and a bottom located at a first depth;
    a second trench in the substrate, the second trench having sidewalls and a bottom located at the first depth;
    a first dielectric liner on the sidewalls and the bottom of the first trench;
    a second dielectric liner on the sidewalls and the bottom of the second trench;
    a first dielectric layer in the first trench and being disposed on the first dielectric liner, wherein the first dielectric layer is of a different material from the first dielectric liner;
    a second dielectric layer in the second trench and being disposed on the second dielectric liner, wherein the first dielectric layer is of the same material as the second dielectric layer, and wherein the second dielectric layer is of a different material from the second dielectric liner;
    a third trench extending from the bottom of the second trench into the substrate, the third trench having a bottom located at a second depth, the second depth is deeper than the first depth; and
    a dielectric isolation structure having an upper section in the second trench and a lower section in the third trench, the upper section of the dielectric isolation structure is laterally surrounded by the second dielectric layer in the second trench, wherein the dielectric isolation structure is of a different material from the second dielectric layer.

2. The structure of claim 1, wherein the second dielectric layer includes a nitrogen-containing material and the dielectric isolation structure includes an oxygen-containing material.

3. The structure of claim 1, wherein the second trench has a larger width than the first trench.

4. The structure of claim 3, wherein the second trench laterally encloses the first trench.

5. The structure of claim 1, wherein the first dielectric liner and the second dielectric liner have the same material as the dielectric isolation structure.

6. The structure of claim 1, wherein the second dielectric layer has a top surface, the dielectric isolation structure has a top surface, and the top surface of the dielectric isolation structure is coplanar with the top surface of the second dielectric layer.

7. The structure of claim 6, wherein the first dielectric layer has a top surface, the top surface of the first dielectric layer is coplanar with the top surface of the dielectric isolation structure.

8. The structure of claim 1, wherein the third trench is filled with the lower section of the dielectric isolation structure only.

9. The structure of claim 8, wherein the second trench is filled with the second dielectric liner, the second dielectric layer, and the upper section of the dielectric isolation structure only.

10. The structure of claim 8, wherein the upper section of the dielectric isolation structure directly contacts the second dielectric layer.

11. The structure of claim 1, further comprising a fourth trench in the substrate, the fourth trench is laterally between the first trench and the second trench, and the fourth trench has a bottom located at a third depth, wherein the third depth is deeper than the first depth and shallower than the second depth.

12. The structure of claim 11, wherein the second trench laterally encloses the fourth trench and the first trench.

13. The structure of claim 12, wherein the fourth trench laterally encloses the first trench.

14. The structure of claim 13, wherein the fourth trench is concentric with the second trench.

15. A semiconductor device comprising:
    a substrate;
    a first trench in the substrate, the first trench having sidewalls and a bottom located at a first depth;
    a second trench in the substrate, the second trench having sidewalls and a bottom located at the first depth;
    a first dielectric liner on the sidewalls and the bottom of the first trench;
    a second dielectric liner on the sidewalls and the bottom of the second trench;
    a first dielectric layer in the first trench and being disposed on the first dielectric liner, wherein the first dielectric layer is of a different material from the first dielectric liner;
    a second dielectric layer in the second trench and being disposed on the second dielectric liner, wherein the first dielectric layer is of the same material as the second dielectric layer, and wherein the second dielectric layer is of a different material from the second dielectric liner;
    a third trench extending from the bottom of the second trench into the substrate, the third trench having a bottom located at a second depth, the second depth is deeper than the first depth;
    a dielectric isolation structure having an upper section in the second trench and a lower section in the third trench, the upper section of the dielectric isolation structure is laterally surrounded by the second dielectric layer in the second trench, wherein the dielectric isolation structure is of a different material from the second dielectric layer;
    a gate over the first trench; and
    a source region and a drain region in the substrate, wherein the first trench is laterally between the source region and the drain region, and wherein the second trench and the third trench laterally enclose the first trench, the gate, the source region, and the drain region.

16. The semiconductor device of claim 15, further comprising a fourth trench in the substrate, the fourth trench is laterally between the first trench and the second trench, and the fourth trench has a bottom located at a third depth, wherein the third depth is deeper than the first depth and shallower than the second depth.

17. The semiconductor device of claim 16, wherein the second trench laterally encloses the fourth trench.

18. The semiconductor device of claim 17, wherein the fourth trench laterally encloses the first trench, the source region, and the drain region.

19. The semiconductor device of claim 18, wherein the gate overlaps with the first dielectric liner and the first dielectric layer.

20. The semiconductor device of claim 15, wherein the second trench has a larger width than the first trench.

\* \* \* \* \*